US007013252B1

(12) United States Patent
Shih et al.

(10) Patent No.: US 7,013,252 B1
(45) Date of Patent: Mar. 14, 2006

(54) SIMULATED CIRCUIT NODE INITIALIZING AND MONITORING

(75) Inventors: Bohr-Winn Shih, Meridian, ID (US); John Stuart Mullin, Sr., Boise, ID (US); Brian Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/388,766

(22) Filed: Sep. 2, 1999

(51) Int. Cl.
*G06F 17/50* (2006.01)
*G06F 13/10* (2006.01)
*G06F 9/45* (2006.01)

(52) U.S. Cl. .............................. 703/14; 703/20; 716/5
(58) Field of Classification Search .................... 716/6, 716/5; 703/16, 14, 20
See application file for complete search history.

(56) References Cited

U.S. PATENT DOCUMENTS

| | | | | |
|---|---|---|---|---|
| 5,437,037 | A | | 7/1995 | Furuichi ...................... 395/700 |
| 5,546,562 | A | | 8/1996 | Patel .......................... 395/500 |
| 5,680,332 | A | * | 10/1997 | Raimi et al. .................. 703/13 |
| 5,732,247 | A | | 3/1998 | Dearth et al. ............... 395/500 |
| 5,867,399 | A | | 2/1999 | Rostoker et al. ............. 364/489 |
| 5,946,472 | A | | 8/1999 | Graves et al. ............... 395/500 |
| 5,980,096 | A | * | 11/1999 | Thalhammer-Reyero ..... 707/100 |
| 5,991,523 | A | | 11/1999 | Williams et al. ........ 395/500.19 |
| 6,006,022 | A | | 12/1999 | Rhim et al. ............. 395/500.02 |
| 6,006,166 | A | | 12/1999 | Meyer ......................... 702/119 |
| 6,009,256 | A | | 12/1999 | Tseng et al. ............ 395/500.34 |
| 6,026,230 | A | | 2/2000 | Lin et al. ................ 395/500.34 |
| 6,090,149 | A | * | 7/2000 | Nair et al. .................... 703/14 |
| 6,175,946 | B1 | * | 1/2001 | Ly et al. ........................ 716/4 |
| 6,285,975 | B1 | * | 9/2001 | Nair et al. .................... 703/14 |
| 6,421,808 | B1 | * | 7/2002 | McGeer et al. ................ 716/1 |
| 6,542,860 | B1 | * | 4/2003 | McBride ....................... 703/14 |

OTHER PUBLICATIONS

IEEE Standard Multivalue Logic System for VHDL Model Interoperability (Std_logic_1164). Copyright 1993.*
Mueller, Martin. "Chronology TimingDesigner V1.2", Printed Circuit Design, San Francisco, CA. Jan. 1993.*
Tzartzanis, Nestoras. "Verilog for Behavioral Modeling". Feb. 3, 1998. Reprinted from www-scf.usc.edu/~ee577/tutorial/verilog/verilog_lec.pdf.*
Silicon Integration Initiative, Inc. "Electronic Component Information eXchange (ECIX)—Timing Diagram Markup Language (TDML) Sample Instances". May 18, 1999.*
De Micheli, Giovanni. "Synthesis and Optimization of Digital Circuits", pp. 104-106. Copyright 1994.*
Ralston, A. and Meek, C. "Encyclopedia of Computer Science". Pp. 182-183, and 943. Copyright 1976.*
McDermott, Robert. "Transmission Gate Modeling in an Existing Three-Value Simulator". 19th IEEE Design Automation Conference. 1982.*

(Continued)

*Primary Examiner*—Paul L. Rodriguez
*Assistant Examiner*—Ayal Sharon
(74) *Attorney, Agent, or Firm*—Schwegman, Lundberg, Woessner & Kluth, P.A.

(57) ABSTRACT

An initial condition (IC) behavior module is described for use in a hardware definition language simulation system which operates in two phases. In the first phase, the IC module sets an initial logic condition onto a user-selected node which is to be monitored. The IC module will release the initial condition and then test the node value to determine if the simulation system is able to resolve the node. Alternatively, the IC module may release the node if a user-defined IC time period passes. In the second phase, the IC module monitors the node and reports an error message if the simulated node value becomes unacceptable.

32 Claims, 9 Drawing Sheets

OTHER PUBLICATIONS

IEEE Std 1364-1995. IEEE Standard Hardware Description Language Based on the Verilog® Hardware Description Language Copyright 1995. pp. i-ix, and Sections 1,3,6,7,9, 12,14,18,19,22,Index.*

IEEE Std. 1164-1993. IEEE Standard Multivalue Logic System for VHDL Model Interoperability (Std_logic_1164). (c) 1993.*

Smith, D. J. "VHDL & Verilog Compared & Contrasted—Plus Modeled Example Written in VHDL, Verilog and C." Proc. 33rd Design Automation Conf. Jun. 3-7, 1996. pp. 771-776.*

Berman, V. "Standard Verilog-VHDL Interoperability." Proc. VHDL Int'l Users Forum. May 1-4, 1994. pp. 142-149.*

QuickLogic QuickNote #61 "Initializing Flip-flops in QuickWorks Simulations". Last Updated: Mar. 19, 1998.*

Maginot, S. "Evaluation Criteria of HDLs: VHDL Compared to Verilog, UDL/I, and M". Proc. EURO-DAC '92. Sep. 1992. pp. 746-751.*

Pillage, L.T. et. al. "Asymptotic Waveform Evaluation for Circuits Containing Floating Nodes." IEEE Int'l Symposium on CIrcuits and Systems. May 1-3, 1990. vol. 1, pp. 613-616.*

Lai, F.S. et al. "Differential Cascode Voltage Switch with the PASS-Gate (DCVSPG) Logic Tree for High-PErformance CMOS Didital Systems." Proc. of Technical Papers, 1993 Int'l Symposium on VLSI Technology, Systems and Apps. May 12-14, 1993. pp. 358-362.*

* cited by examiner

SIMULATED CIRCUIT NODE INITIALIZING AND MONITORING

TECHNICAL FIELD OF THE INVENTION

The present invention relates generally to electronic circuitry simulation programs and in particular to program modules that control initial conditions and provide error detection for simulated circuit nodes.

COPYRIGHT NOTICE/PERMISSION

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever. The following notice applies to the software and data as described below and in the drawings hereto: Copyright© 1999, Micron Technology, Incorporated, All Rights Reserved.

BACKGROUND OF THE INVENTION

Electronics have become part of almost every aspect of modern life, from television sets to toasters. As technology progresses, electronic circuits become increasingly complex. Designing a circuit with hundreds or even thousands of individual electronic components has become a great challenge for circuit designers. The challenge becomes even greater when many iterations of prototypes are required to test out the circuits and prove their viability. As the number of components multiply, building the actual circuit and modifying it becomes an expensive and time consuming proposition.

To overcome the problems associated with working with real components, circuit designers turned to computers to aid them with their designs. By using a computer, designers could create "virtual" circuits. This enabled designers to create, modify and test circuits without actually building the circuit with real components. Hardware Description Languages (HDL) were developed to aid designers in creating the virtual circuits. HDL programs allow designers to choose from a standardized set of instructions while designing their circuits on computers. Many different HDL programs have been written, each with varying capabilities. Among these HDL programs is Verilog HDL which is widely used and is considered an industry standard among circuit designers.

Verilog HDL uses the computer to simulate complex circuit designs with various inputs and outputs. It uses "modules" or lines of code representing a desired function as building blocks to create the simulation. The designer builds simulated circuitry by simply selecting and connecting the desired modules. Individual "nodes" or electrical connection points of the circuit can be analyzed while changing input variables to the circuit. The designer can even initialize nodes of the circuitry to various logic values before the simulation is started. Currently, however, this initial node parameter is not stabilized and will "float" or change to an unknown logic value during the simulation run. The designer has no way of knowing when or if the initial condition of the node has changed. If this is crucial to the design, it presents a serious, time consuming issue to surmount.

One method of overcoming this problem is to write a separate simulation program and use Verilog's Programming Language Interface (PLI) to export the desired node value to the separate simulation program. However, this method requires that a specific co-simulation program be written by a programmer for each Verilog simulation. This is both costly and time consuming and slows down the design cycle. Accordingly, what is needed is a simulation initialization and monitoring solution that is both quick and cost effective to use in circuit design, especially when using Verilog HDL.

SUMMARY OF THE INVENTION

The present invention provides a method and apparatus for initializing and monitoring a simulated circuit node in a simulation system. An initial condition (IC) behavior module is provided in a hardware definition language simulation system which operates in two phases. In the first phase, the IC module sets an initial logic condition onto a user-selected node which is to be monitored. The IC module will release the initial condition and then test the node value to determine if the simulation system is able to resolve the node. Alternatively, the IC module may release the node if a user-defined IC time period passes. In the second phase, the IC module monitors the node and reports an error detection message if the simulated node value becomes unacceptable.

These and other embodiments, aspects, advantages and features of the present invention will be set forth in part in the description which follows, and in part will become apparent to those skilled in the art by reference to the following description of the invention and referenced drawings or by practice of the invention. The aspects, advantages and features of the invention are realized and attained by means of the instrumentalities, procedures and combinations particularly pointed out in the appended claims.

DETAILED DESCRIPTION OF THE EMBODIMENTS

Figure 1:
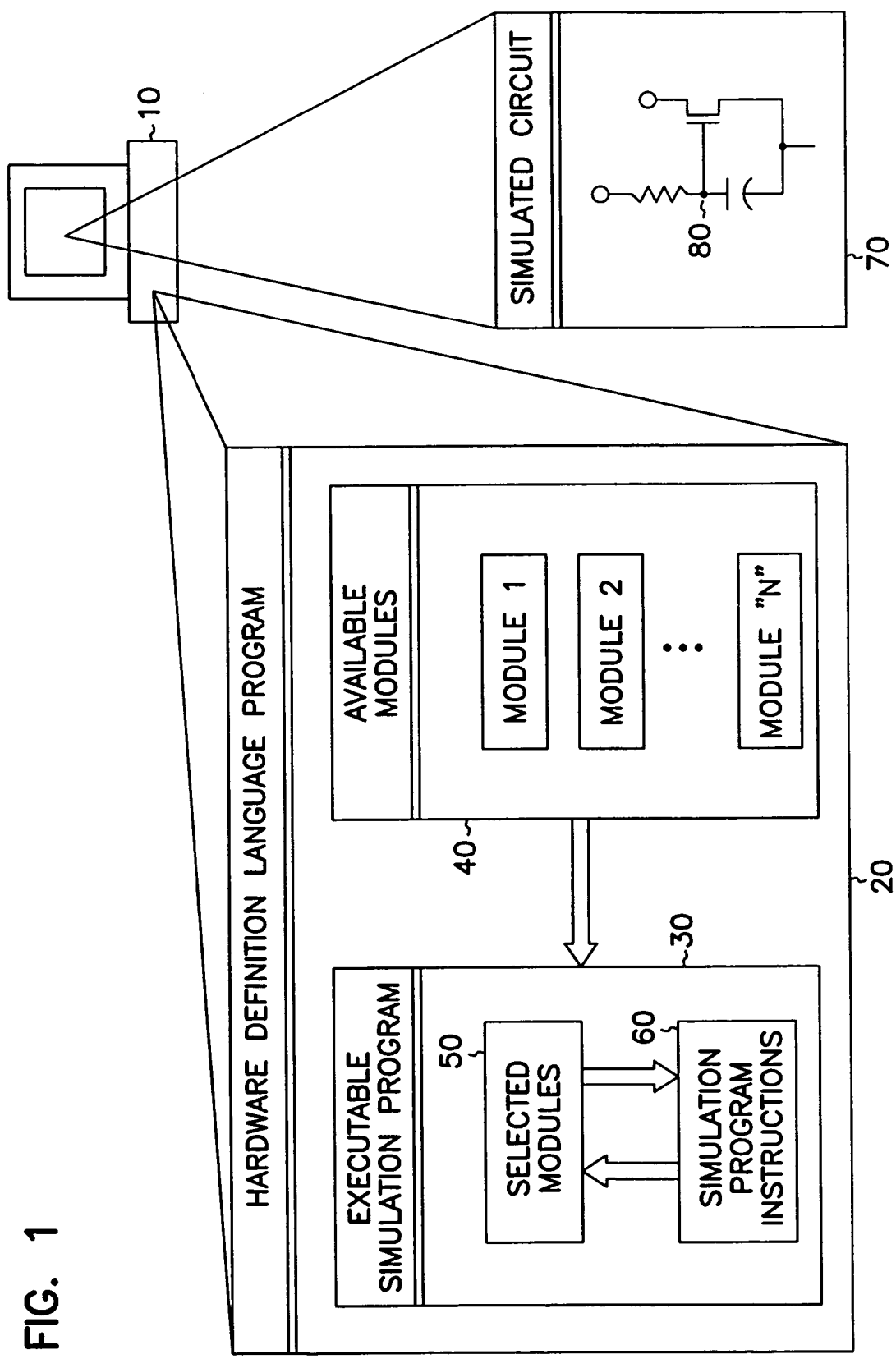
FIG. 1 is a diagram depicting an environment of one embodiment of the present invention.

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical or software changes may be made without departing from the scope of the present invention. The following detailed description is, therefore, not to be taken in a limiting sense, and the scope of the present invention is defined only by the appended claims.

The present invention is used in conjunction with a computer software program and, thus, requires some understanding of how the computer program operates. In order to provide a clearer understanding, a description of how the computer software program is used relevant to the invention is provided, followed by detailed descriptions of the present invention's embodiments.

Verilog HDL is a hardware description language for designing and documenting digital logic systems. The language is used to create programs that simulate the interaction between components. The programs are composed of one or more independently developed modules that are not combined until the program is linked. A single module can contain one or more routines which are sections of a program that perform a particular task or tasks. Generally, it is the program user who decides which modules will be linked to perform an executable program. Modules are usually chosen from a list in a way that when linked they will perform a desired behavior. With programs such as Verilog HDL, the modules can be linked to form complex logic systems with complicated behavioral characteristics. The program user can define intricate input logic levels and create detailed electronic components that alter the logic levels to produce an output logic level with the user's designed specifications.

Often it is desirable to be able to monitor a logic level within the circuitry itself and not just at the final output. The user may also require that an initial logic level, also known as an initial condition, be set on certain nodes within the system to be simulated before executing the program. In order to accomplish these tasks, a separate simulation program is usually written using the Programming Language Interface (PLI) function of the Verilog HDL. The PLI consists of an interface mechanism, a set of routines to interact with the simulation environment and a set of routines to access the Verilog HDL internal data structures, providing dynamic interaction with the electronic circuitry simulation and the data structures. The disadvantages of PLI is that a separate co-simulation program is required and often times the interaction of the PLI program causes the Verilog HDL program to slow down to allow the data to be transferred back and forth between the two programs. This limits any "real time" analysis of the electronic circuitry.

The current invention is a behavior module that performs initializing and monitoring and manipulating logic level functions. Because it is a module, it is selectable from within a hardware design language program, such as Verilog HDL, and eliminates the need and constraints of a PLI co-simulation program. This initial condition (IC) module provides a means to initialize logic nodes (force an initial logic condition) to a desired logic level and to release the node if certain conditions are met. The release of the node means that the simulation program is free to change the logic value of the node if simulation warrants a change in the logic value. Before release, the logic value of the node is forced.

The IC module will release the node if certain conditions are met. One condition is the passage of time. The IC module may be programmed to hold the initial condition of the node for a user-defined period of time. After expiration of that user-defined time period, the node is released. Another release of the node by the IC module is when the simulation system is able to resolve the logic level of the node. Resolving the node means that the inputs to the node are known and therefore the logic value of the node can be determined through simulation by the simulation program. Thus, the IC module will release the node if the node can be resolved. Those skilled in the art will recognize other conditions upon which the node may be released.

The IC module can also monitor the node after it is released. If the node has been released, and the logic value of the node later becomes unknown, the IC module flags this as an error condition which may be the result of a logic design error. When monitoring the node, one skilled in the art will appreciate that an error condition from the IC module can be used to trigger error messages, halt simulation programs, trigger other parts of the simulated circuitry or viewed on a display device.

The convenience of having the ability to select a module to perform these functions also removes the timing constraints imposed by PLI co-simulation programs. The module allows for "real time" monitoring and analysis of the node voltage during the simulation program execution. The time and expense of writing a separate co-simulation program for the PLI is completely eliminated. A single user can insert the module where needed as they construct the simulated circuit, saving both time and money.

FIG. 1 is an example of an environment in which the present invention operates. A computer system 10 contains a hardware definition language program 20 which is stored on the computer system 10 hard drive in this example. Within the HDL program, is an executable simulation program 30 and a resource set of available modules 40. A user selects which modules to use from the available modules 40 and these modules become part of the executable simulation program 30. The selected modules 50 then interact with simulation program instructions 60 to form the executable simulation program 30.

Figure 2:
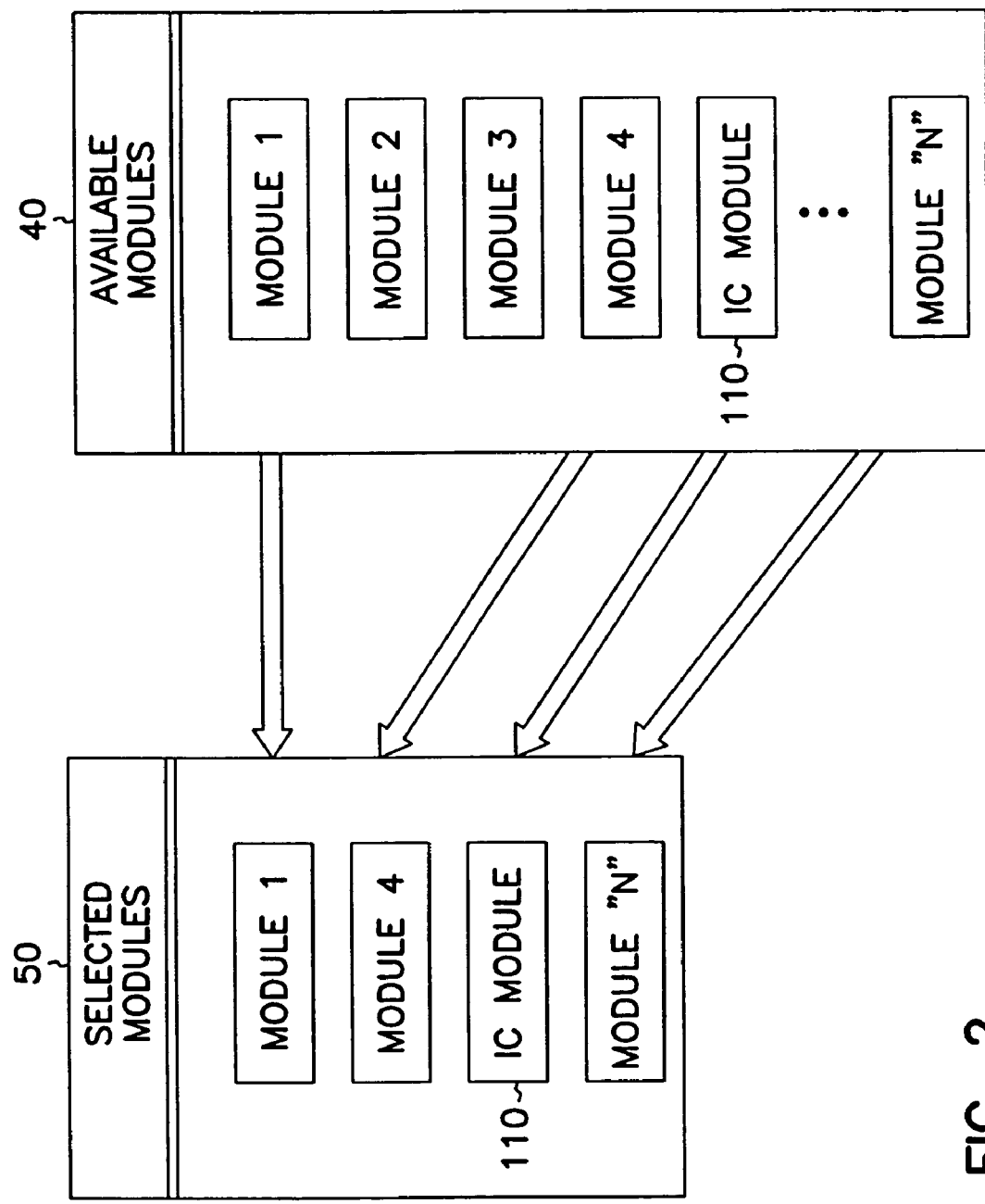
FIG. 2 is a block diagram illustrating how the present invention is selected for use in one embodiment.

FIG. 2 shows an enlarged list of selected modules 50 and an enlarged list of available modules 40. Normally, not all of the available modules 40 are executed as part of the executable simulation program 30. The present invention behavior module is selectable from the list of available modules 40. In the example of FIG. 2, the present invention module is called an initial condition module or an IC module 110. To use the IC module 110, the user selects it from the list of available modules 40 and then it becomes part of the selected modules 50 which are used during the execution of the simulation program 30. Referring back to FIG. 1, when the simulation program 30 is executed, a simulated circuit 70 with the user's design characteristics is created. Generally, the simulated circuit 70 will have many connections or nodes such as node 80. This simulated circuit 70 is then tested by varying parameters such as the initial condition value of node 80.

Figure 3:
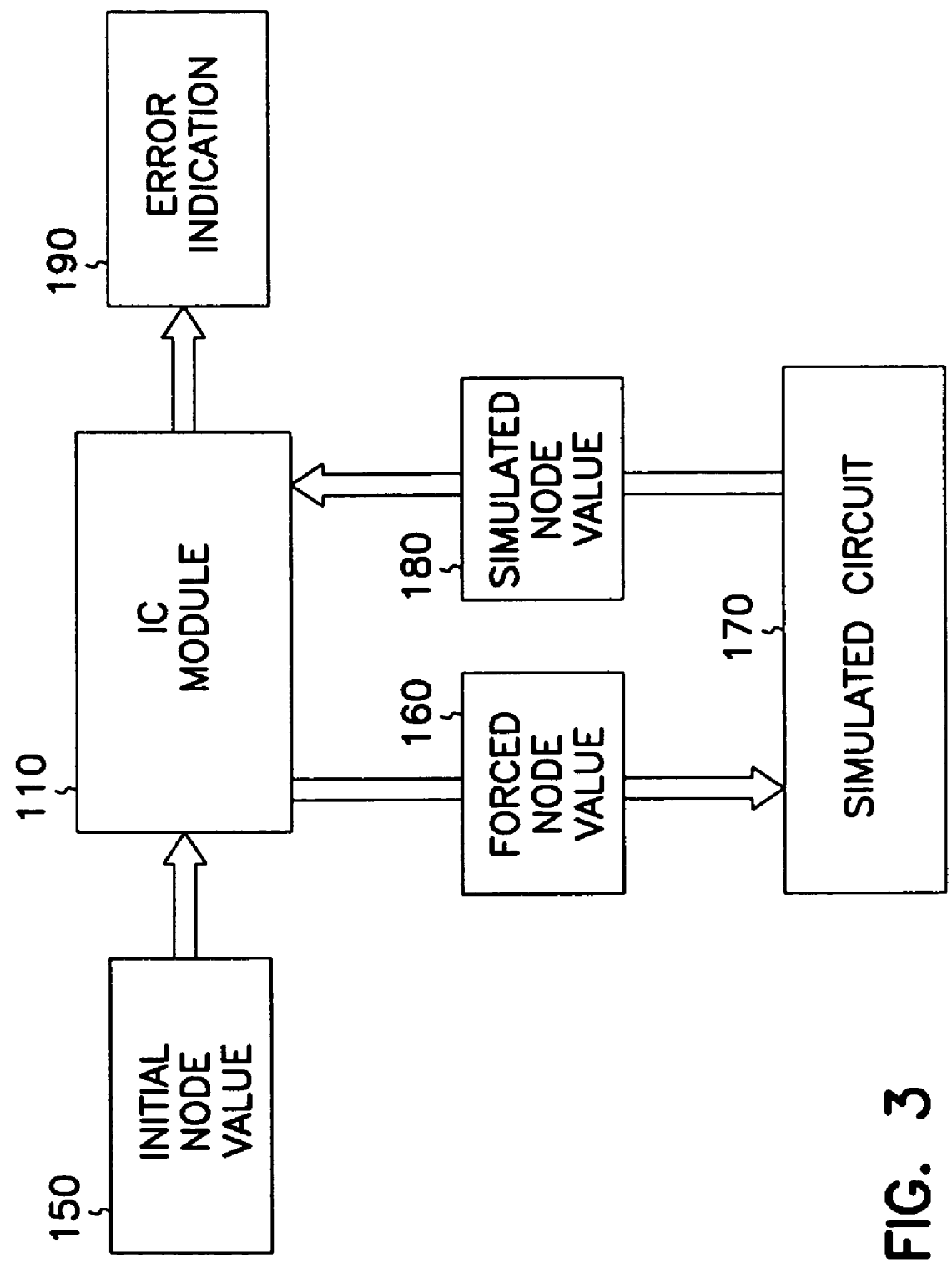
FIG. 3 is a block diagram of one embodiment of the present invention.

In one embodiment shown in FIG. 3, the IC module 110 contains routines to allow an initial node value input 150, a forced node value output 160, a simulated node value input 180 and an error indication output 190. The initial node value input 150 is either a user definable variable or a variable determined from within the executable simulation program or external to the executable simulation program. The initial node value input 150 is the initial logic value that the node is set to at the start of the simulation program. The initial logic condition may be a logic one, logic zero or high-impedance. The IC module 110 forces the logic level 160 for the node 80 if conditions warrant the forcing. If the forced initial condition is still warranted (as described above), the simulated circuit 170 is then simulated based upon the forced value 160 for that node.

The forced node value 160 is then released to allow the simulated node value 180 to be input to the IC module 110. The simulated node value is monitored by the IC module monitoring routine during the simulation program execution and after the release of the node. If the node value changes to an unknown value, the IC module reports an error detection via the error indication output 190. To one skilled in the art, it can be appreciated that the error detection can be triggered by other events besides a node value that is unknown. For example, the error condition can be triggered by the node value remaining unchanged for a length of time. The modules are linkable, and it is within the scope of the claimed invention to have several modules interconnected or one module linked to multiple nodes.

Figure 4:
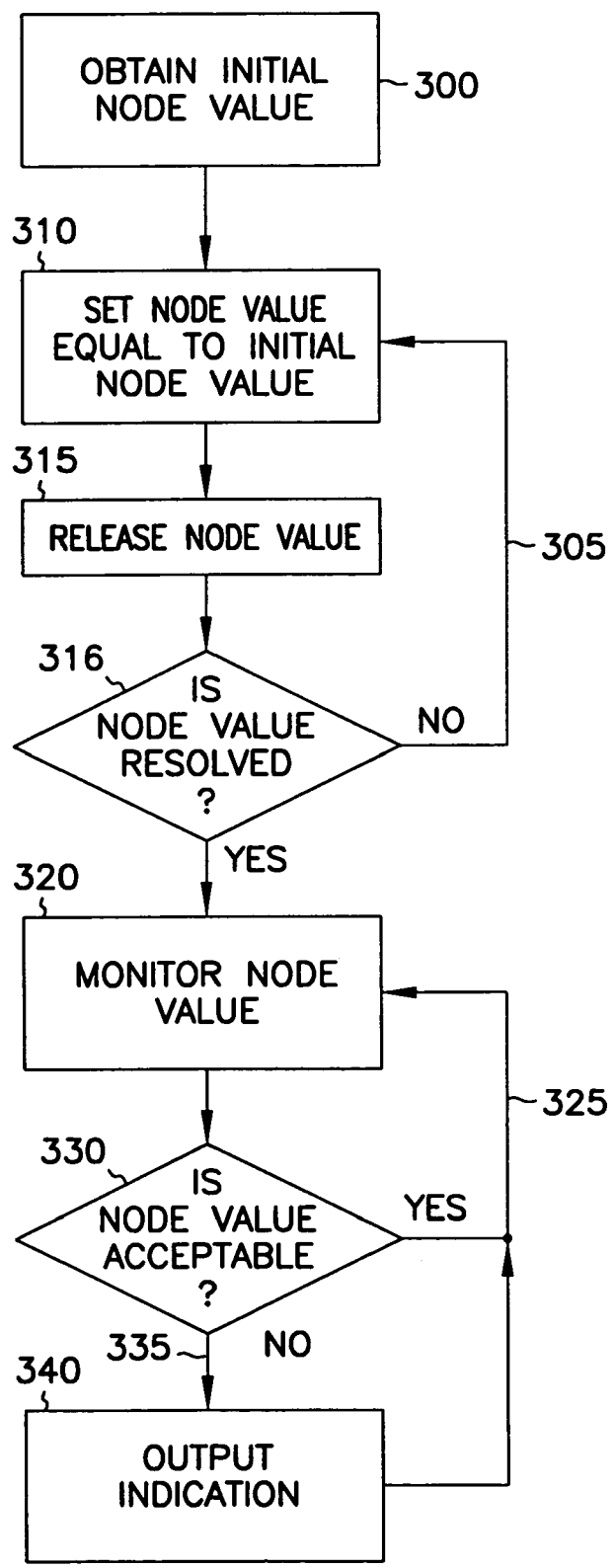
FIG. 4 is a functional flow diagram of the embodiment shown in FIG. 3.

FIG. 4 shows a data flow chart for the embodiment show in FIG. 3. The operation of the IC module 110 can be viewed in two phases. In the first phase of operation, an initial node value (logic level) is set at 300 for a selected node. The logic level for the selected node value is held at that value until it is released by the IC module. As the simulation begins, the value is forced to the initial condition at 310 to hold the logic value on the node. As the simulation progresses to the next time step, the node is then released at 315 to allow the simulation program to attempt to resolve the node value. The value of the node is then tested at 316 to determine if the simulation software was successful in resolving the node value. If the node value is indeterminable or unknown at 316, the IC module will force the initial condition 310 once again via 305 of FIG. 4. If the simulation software is successful in resolving the value of the node, then IC module enters a second phase of operation to monitor the node value. In the alternative, if a user-defined IC manipulation time period expires, the IC module will enter the second phase.

In the second phase of operation, IC module 110 can continue to monitor the node value 320 until the end of simulation or until it is halted by a user-defined time limit, or by some other mechanism known to those skilled in the art. The node value is continually tested at 330 to determine if the node value changes to an unknown, indeterminable or otherwise unacceptable logic state. If the value is valid, the IC module 110 continues to monitor the node value at 320 via 325. If the value is unacceptable, an indication of this condition is made at 340 via 335 and the simulation continues as control is passed via 325 to continue to monitor the node at 320 after the unacceptable condition is noted at 340.

Figure 5:
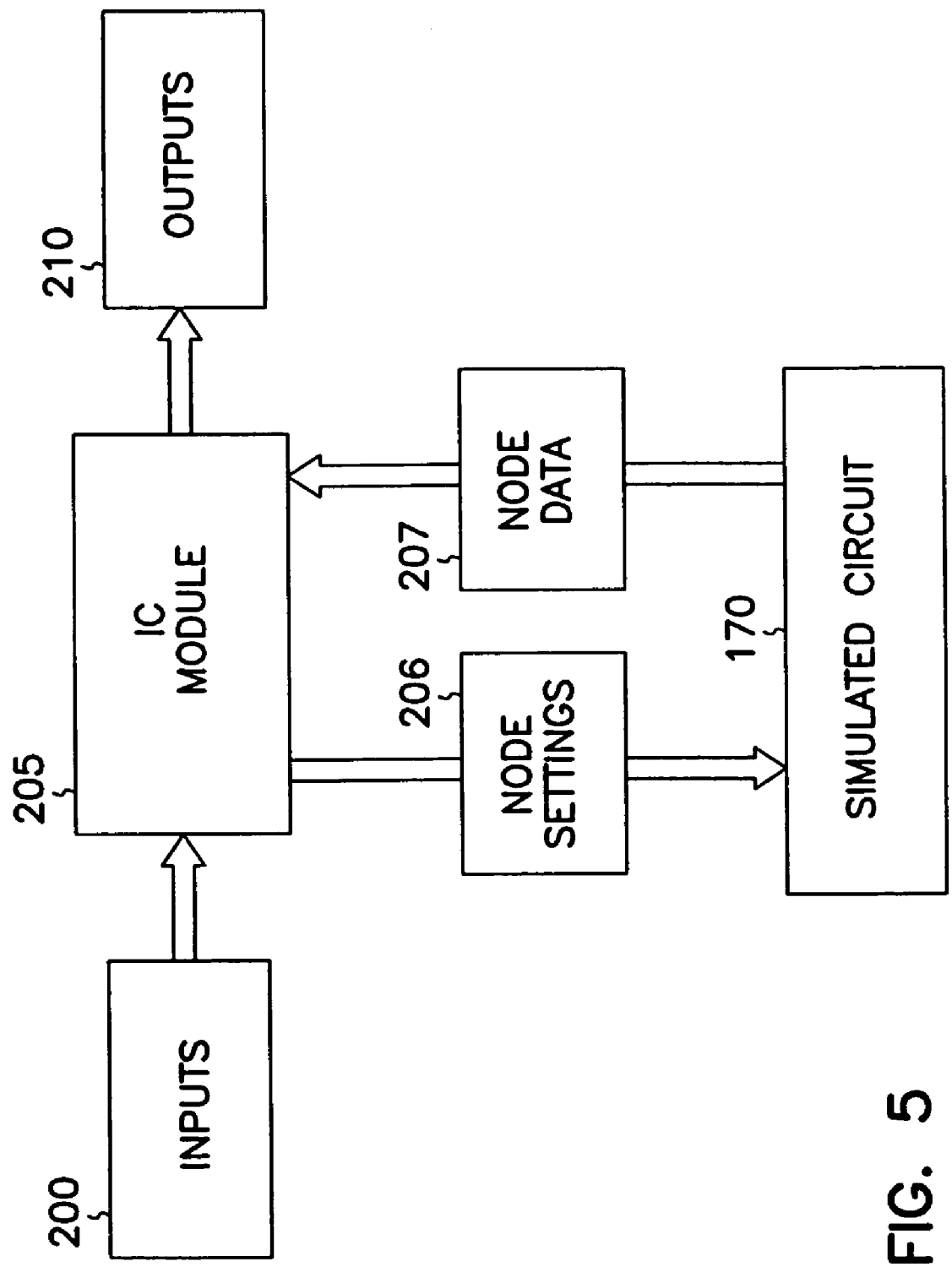
FIG. 5 is a block diagram of another embodiment of the present invention.
Figure 6:
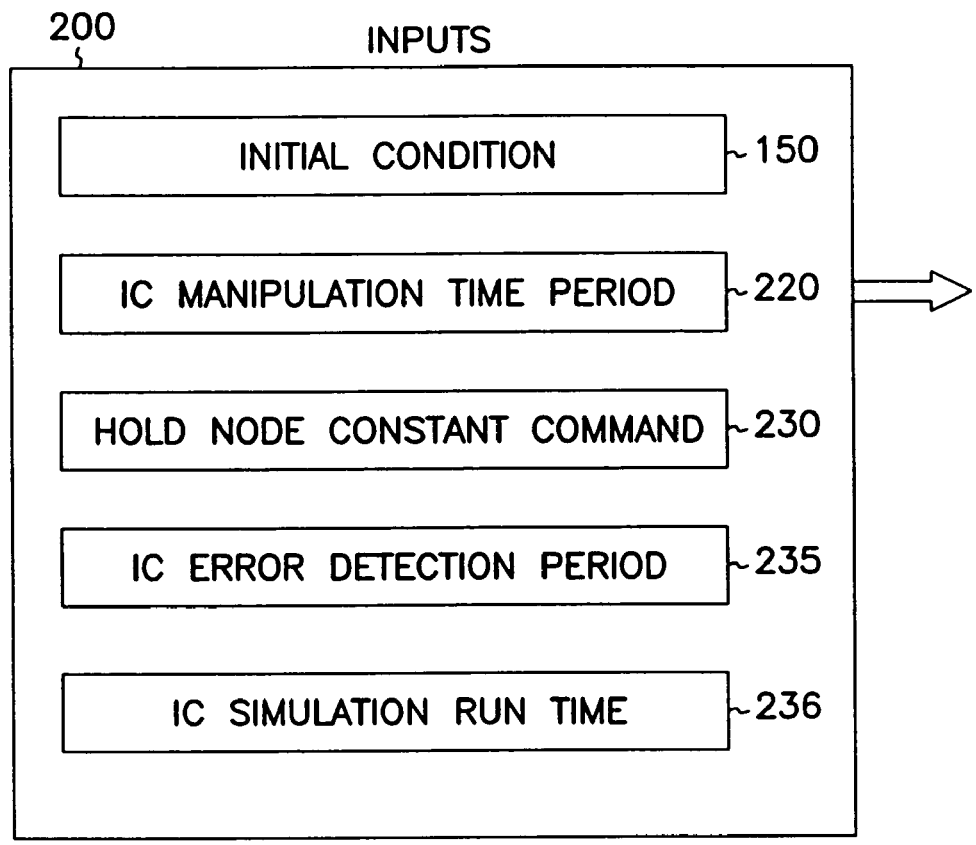
FIG. 6 is an expanded view of the inputs of the embodiment of FIG. 5.
Figure 7:
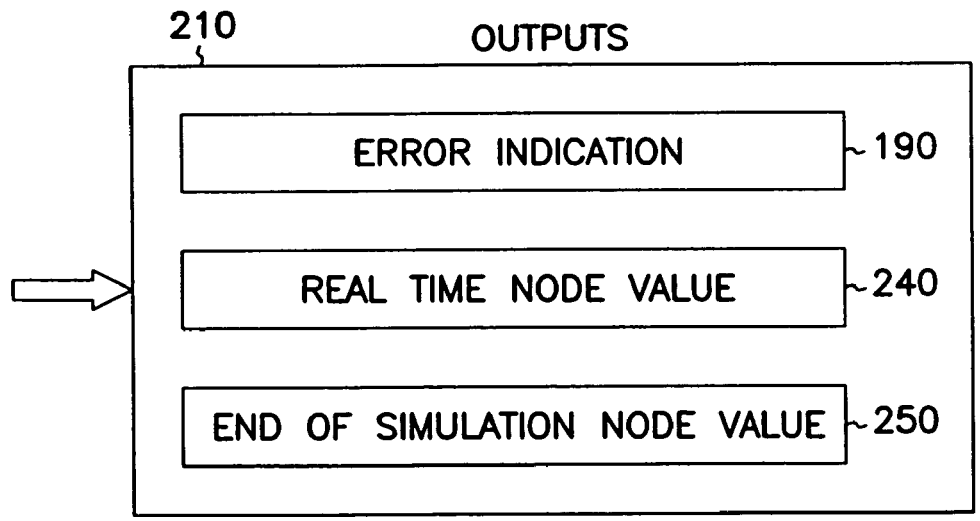
FIG. 7 is an expanded view of the outputs of the embodiment of FIG. 5.

Another embodiment is shown in FIGS. 5–7. The IC module 205, as shown in FIG. 5, includes inputs 200, outputs 210, node settings 206 and node data 207 interfaces. The inputs 200 contain additional routines to allow an IC manipulation time period 220, a hold node constant command 230, an IC error detection period 235 and an IC simulation run time 236 as shown in FIG. 6. Additional routines are also included in outputs 210 to allow an error indication 190, a real time node value output 240 and an end of simulation node value output 250 as shown in FIG. 7.

The IC manipulation time period 220 is set to force the simulation node 80 to contain the desired information within the desired time interval of simulation program execution. The hold node constant command 230 is used to pass the node settings 206 to the simulation circuitry 170 such that the node value remains constant when the release conditions are met in IC module 205. The hold node constant command 230 allows a user, an internal link or an external link to instruct the module to force the node value to a constant value for the duration of the simulation program execution or until a release condition such as at a user-defined IC manipulation period 220 or if resolved.

To one skilled in the art, it can be appreciated that the IC manipulation time input 220 can be used to control the length of time that the node is held to a constant value. The real time node value output 240 is the node value as monitored via the node value input 207 and is output for the duration of the error detection period 235. The IC error detection period 235 is used by the module to monitor the node logic value during the simulation program execution. To one skilled in the art, it can be appreciated that this input value can be used to limit the duration of the monitoring activities of the module even before the simulation program has fully executed.

The IC simulation run time input 236 is used by the module to determine the start and finish of the IC simulation program execution. This time is used to determine the end of simulation node value output 250 based on a user-defined period of time executing the simulation program.

The module outputs 210 are displayable by any number of means including CRT displays, printouts and any device used to convey information. The module outputs are also usable as inputs to other modules to provide further control of the simulation program or to trigger other events, internal or external to the simulation program. The module inputs 200 are input by any number of means including keyboards, touch screens and any device used to input information. The module inputs are also linkable to outputs of other modules to provide further control of the simulation program or to trigger other events.

Figure 8:
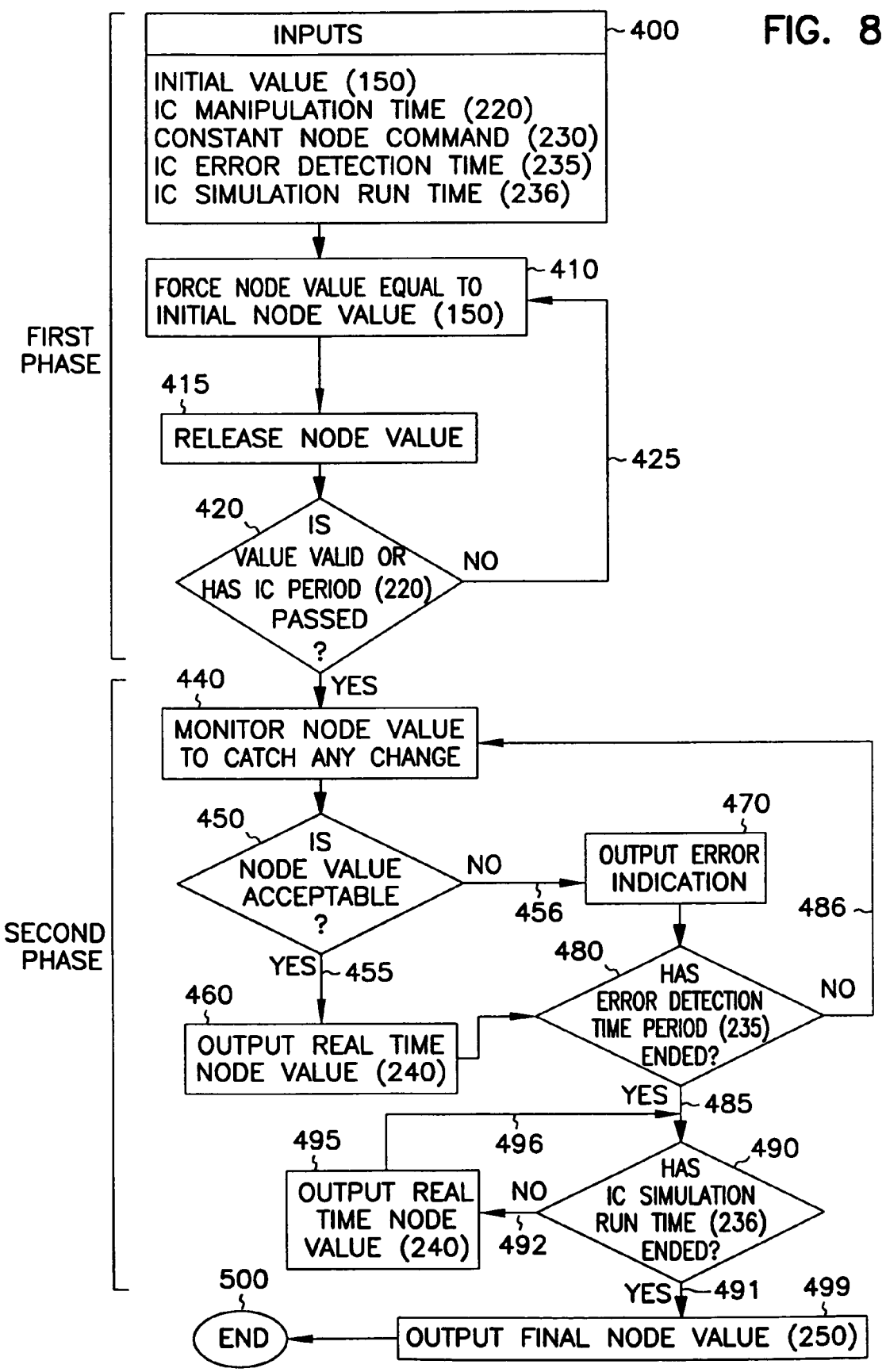
FIG. 8 is a functional flow diagram of the embodiment of FIG. 5.

FIG. 8 shows a flow chart for the embodiment shown in FIGS. 5–7. In this embodiment, two general phases are shown. In the first phase, an initial node value, an IC manipulation time, a hold node constant command, an error detection period and an IC simulation run time are obtained 400 and then a simulated circuit node value for the node to be controlled/monitored is forced to equal to the initial node value 410. As the simulation progresses to the next time step, the IC module 205 then releases the node value at 415 to allow the simulation software of the simulated circuit 170 to attempt to resolve the value of the node. A check is then performed at 420 to determine if the node value has been resolved and is therefore valid. If the simulation software has been unable to resolve the node value to an acceptable or valid logic condition (e.g.: logic one, zero or high-impedance), the IC module 205 will once again force the initial condition on the node at 410. The simulation will then continue by once again releasing the node at 415 and testing again at 420. This loop will continue until the node resolves to a valid value. In the alternative, if a user-defined IC manipulation time period 220 passes, control will pass to the second phase to monitor the node value at 440. Those skilled in the art will readily recognize that what is a valid condition and what is invalid is determined by the needs of the user using the simulation program. In some applications, an invalid or unknown logic state may be acceptable.

If the node resolves to a valid logic state or if the user-defined IC manipulation time period 220 has passed, then phase two of the operation of the IC module 205 begins. The second phase shown in FIG. 8 is the monitoring phase which begins at 440. At this point, the simulated circuit node is monitored 440 to catch any logic state change. If there is any change of the node value detected, the node value is tested to see if it is acceptable at 450. If the node value is acceptable (decision branch 455), the value of the node is output to the user at 460. If the node value is unacceptable (decision branch 465), an error indication is output 470. Afterwards, a check is performed at 480 to see if the error detection time period 235 is ended. If the IC error detection period 235 has not expired (decision branch 486), the control flow returns to monitoring the node at 440 and the cycle is repeated. If the user-defined error detection time period 235 has ended (decision branch 485), simulation advances to decision block 490 via path 485. If the IC simulation run time 236 is ended in 490, the final value of the node is output via 491 to the user at 499 and the IC simulation is ended at 500, otherwise the real time value can be output via 492 to the user at 495 and the check loop is repeated via 496 until the end of IC simulation run time 236 is complete. Those skilled in the art will readily recognize that what is a valid/acceptable condition and what is invalid/unacceptable condition is determined by the needs of the user using the simulation program. In some applications, an unknown logic state may be recognized as acceptable.

Figure 9:
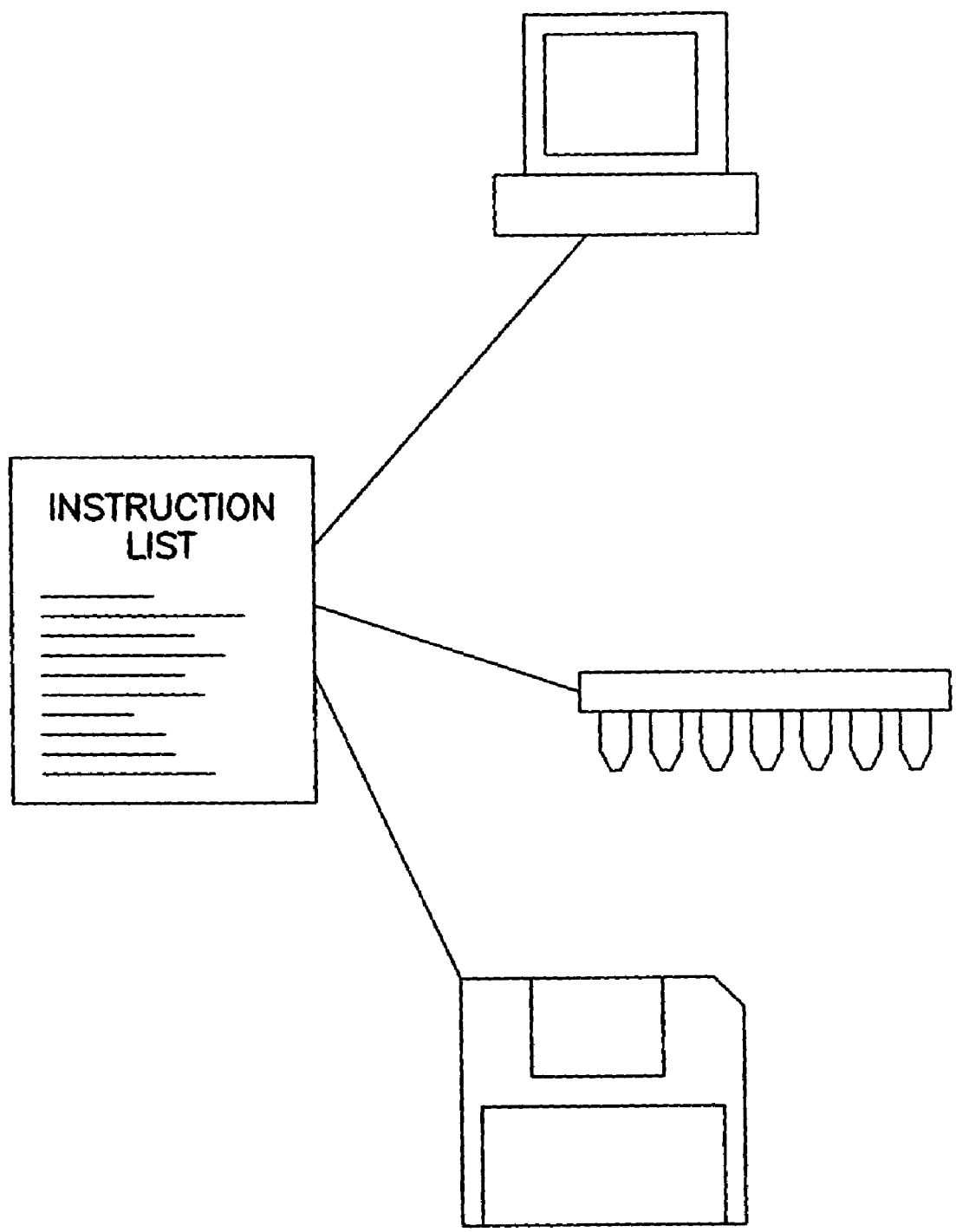
FIG. 9 is a depiction of examples of the media on which the present invention can reside.
Figure 10:
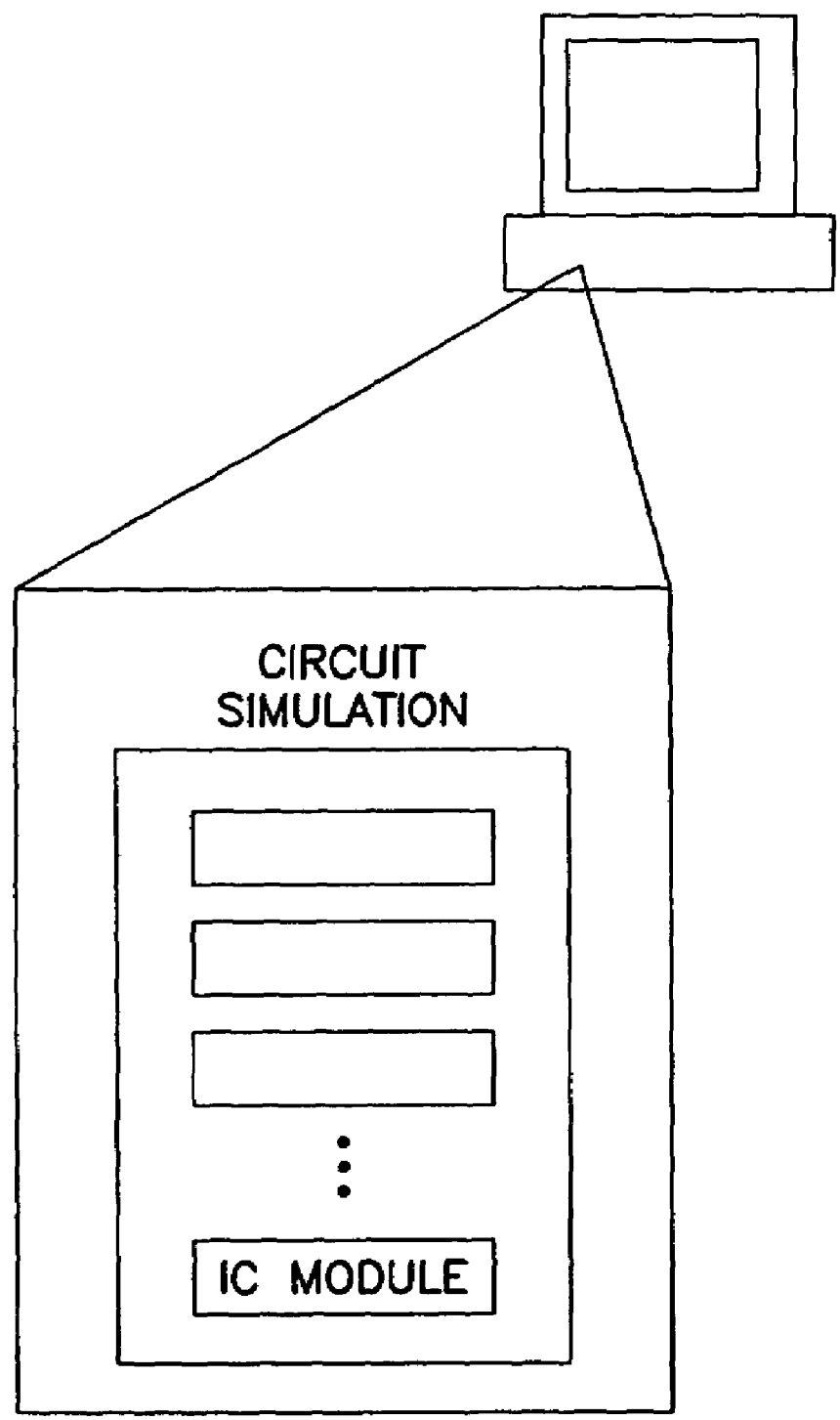
FIG. 10 is another embodiment of the present invention in a computer system.

In another embodiment of the invention shown in FIG. 9, the module is part of a list of instructions found on computer readable media such as diskettes, hard drives or random access memory. In yet another embodiment of the invention shown in FIG. 10, the module is part of a computer system used to design simulated electronic circuitry.

In summary, the present invention is a module that is easily selected from within the hardware definition language program. It has inputs for setting various parameters used to control and monitor circuit nodes from within a simulation program. The module's outputs provide both control of the circuit node voltage and also information that is displayable or is used to provide further control of other modules.

An advantage of the present invention is that the module is part of the simulation program and not a separate co-simulation program. This allows faster simulation and eliminates the need to write another program. Both of these aspects save time and money. Another advantage is the ease of use afforded the user due to the fact that the module is selectable as part of the simulation program and can be incorporated "on the fly" as the circuit design is being developed. This ensures greater accuracy during troubleshooting and also ensures that the designer is the one who chooses the correct monitoring points.

Other incorporations and uses of the module will be apparent to those skilled in the art. It is to be understood that the above description is intended to be illustrative and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of simulating a node using a simulation program that includes multiple, linked modules, the method comprising:
   executing a first circuit module that simulates a circuit having a node, wherein the node represents a simulated electrical connection point of the circuit;
   simultaneously executing at least one behavior module, which is linked to the first circuit module, and which performs the acts of
      forcing an initial forced logic state on the node;
      after forcing, releasing the node from the initial forced logic state if a predetermined condition is met, which enables the simulation program to change a logic state of the node;
      monitoring the node after the node has been released; and
      providing an indication, in response to the monitoring, when the node is in a preselected condition.

2. The method of claim 1, wherein forcing the initial forced logic state includes forcing to a logic zero, logic one or high-impedance.

3. The method of claim 1, wherein releasing the node further comprises determining that the condition is met after passage of a predetermined amount of time.

4. The method of claim 3, wherein releasing the node further comprises determining that the condition is met when the node has been resolved.

5. The method of claim 1, wherein providing an indication includes indicating when the node is in an unknown logic state.

6. The method of claim 1, further comprising providing an error indication when the node is in a preselected condition.

7. The method of claim 3, further comprising selecting a user-defined time period for the predetermined amount of time.

8. A method of initializing and monitoring a simulated circuit node using a simulation program that includes multiple, linked modules, the method comprising:
   executing a first circuit module that simulates a circuit having a node, wherein the node represents a simulated electrical connection point of the circuit;
   simultaneously executing at least one behavior module, which is linked to the first circuit module, and which performs the acts of
   obtaining an initial node condition for the node, wherein the initial node condition is a logic state;
   forcing the node to the initial node condition;
   after forcing, releasing the node from the initial node condition;
   testing the node for a valid condition after the node has been released;
   monitoring the node after the node has been released; and
   providing an indication, in response to the monitoring, when the node is in an undesirable condition.

9. The method of claim 8, wherein the initial node condition is forced again if the testing indicates that the node has an unknown logic value.

10. The method of claim 9, wherein the initial node condition is forced and simulation is repeated until the node has a valid logic value.

11. The method of claim 10, wherein monitoring only occurs after the node has a valid logic value.

12. The method of claim 8, further comprising outputting the condition of the simulated node.

13. The method of claim 8, further comprising obtaining a simulation run time.

14. The method of claim 13, further comprising outputting a final node condition when the simulation run time is completed.

15. A computer-readable medium having computer-executable instructions comprising:
   at least one selectable circuit module, which when executed simulates a circuit having a node, wherein the node represents a simulated electrical connection point of the circuit; and
   at least one selectable behavior module, which is linkable to a circuit module, and which when executed simultaneously with the at least one selectable circuit module results in performing the following acts:

forcing an initial forced logic state on the node;
after forcing, releasing the node from the initial forced logic state if a predetermined condition is met, which enables a simulation program to change a logic state of the node;
monitoring the node after the node has been released; and
providing an indication, in response to the monitoring, when the node is in a preselected condition.

16. The medium of claim 15, having further computer-executable instructions for forcing the initial forced logic state to a logic zero, logic one or high-impedance.

17. The medium of claim 15, having further computer-executable instructions for determining that the condition is met after passage of a predetermined amount of time.

18. The medium of claim 15, having further computer-executable instructions for determining that the condition is met when the node has a valid logic value.

19. The medium of claim 18, having further computer-executable instructions for indicating when the node is in an unknown logic state.

20. A simulation module of a simulation program, the simulation module comprising:
an input means for inputting an initial node condition into a simulated circuit node of a circuit module linked with and simultaneously executable with the simulation module, wherein the simulated circuit node represents a simulated electrical connection point of the circuit module;
a conveying means for conveying the initial node condition to the simulated circuit node;
release means for releasing the simulated circuit node from the initial node condition upon satisfaction of a condition, wherein releasing the simulated circuit node occurs after conveying and enables the simulation program to change a logic state of the simulated circuit node;
a monitoring means for monitoring the simulated circuit node for a node condition after releasing the simulated circuit node from the initial node condition; and
an output means, responsive to the monitoring means, for outputting an indication when the node condition is in an undesirable state.

21. The module of claim 20, further comprising an output means for outputting the node condition.

22. The module of claim 20, further comprising an input means for inputting a simulation run time.

23. The module of claim 22, further comprising an output means for outputting a final node condition at completion of the simulation run time.

24. A computerized system for initializing and monitoring a simulated circuit node, the system comprising:
a circuit simulation tool;
at least one selectable circuit module, which when executed simulates a circuit having the simulated circuit node, wherein the simulated circuit node represents a simulated electrical connection point of the circuit; and
at least one selectable behavior module, which is linkable to and simultaneously executable with a circuit module, and which includes
a first input means for inputting an initial node condition;
a conveying means for conveying the initial node condition to the simulated circuit node;
a release means for releasing the initial node condition, wherein releasing the initial node condition occurs after conveying and enables the circuit simulation tool to change a logic state of the simulated circuit node;
a monitoring means for monitoring the simulated circuit node for a node condition after releasing the initial node condition;
a first output means for outputting an indication when the node condition is in an undesirable state, in response to the monitoring;
a second input means for inputting a simulation run time; and
a second output means for outputting a final node condition at completion of the simulation run time.

25. An HDL initial condition module comprising:
a means for maintaining a logic level of a simulated circuit node until a release condition is met, wherein
the simulated circuit node represents a simulated electrical connection point of a simulated circuit, and the simulated circuit is produced by an HDL circuit module that is linkable to the HDL initial condition module, and
a simulation program is able to change a logic state of the simulated circuit node after the release condition is met, wherein the release condition is when a known logic state can be determined for the simulated circuit node;
an initial condition release means, which enables the simulation program to change the logic level after the release condition is met; and
a simulated circuit node error detection means, which monitors the simulated circuit node for a node condition.

26. The module of claim 25, wherein the
means for maintaining the logic level of the simulated circuit node maintains the logic level for a predetermined period of time, and
wherein the module further comprises:
means for releasing an initial condition after the release condition is met, wherein the predetermined period of time is a simulation run time defined by an HDL simulation executable program.

27. The module of claim 26, wherein the predetermined period of time is a user-defined period of time.

28. An HDL simulated circuit device, comprising:
a circuit HDL module, which when executed simulates a circuit having a first simulated node, wherein the first simulated node represents a simulated electrical connection point of the circuit;
a first HDL module, linked to the circuit HDL module, the first HDL module including
a first input submodule inputting a first initial node condition,
a first conveyance submodule conveying the first initial node condition to the first simulated node,
a first monitor submodule monitoring the first simulated node for a first node condition, wherein monitoring occurs after conveying, and
a first output submodule outputting, in response to monitoring, a first indication when the first node condition is in an undesirable state;
a second HDL module, linked to the circuit HDL module, the second HDL module including
a second input submodule inputting a second initial node condition,
a second conveyance submodule conveying the second initial node condition to a second simulated node,
a release submodule releasing the second simulated node on a predetermined condition, wherein releasing the second simulated node enables a simulation program to change a logic level of the second simulated node, a second monitor submodule monitoring the second simulated node for a second node condition, wherein monitoring occurs after releasing, and a second output submodule outputting, in response to monitoring, a second indication when the second node condition is in an undesirable state; and wherein the first conveyance submodule additionally conveys the first initial node condition to the second input submodule.

29. An HDL simulated circuit device, comprising:

a circuit HDL module, which when executed, simulates a circuit having a first simulated node, wherein the first simulated node represents a simulated electrical connection point of the circuit;

a first HDL module, linked to the circuit HDL module, the first HDL module including a first input means for inputting a first initial node condition, a first conveyance means for conveying the first initial node condition to the first simulated node, and a first node condition output means for outputting a first indication when a first node condition is in an undesirable state, wherein outputting occurs after conveying;

a second HDL module, linked to the circuit HDL module, the second HDL module including a second input means for inputting a second initial node condition, and a second conveyance means for conveying the second initial node condition to a second simulated node; and a third HDL module, linked to the circuit HDL module, the third HDL module including a release condition means for releasing the second simulated node on a release condition, wherein releasing the second simulated node occurs after conveying and enables a simulation program to change a logic level of the second simulated node, wherein the first node condition output means outputs the first node condition to the second input means if the release condition is valid.

30. An HDL design tool, comprising:

a circuit simulation device; and a plurality of selectable modules capable of being linked to the circuit simulation device, wherein the plurality of selectable modules includes at least one selectable behavior module, which is linkable to a circuit module, and which when executed simultaneously results in inputting an initial node condition into a simulated circuit node of the circuit module linked with the behavior module, wherein the simulated circuit node represents a simulated electrical connection point of the circuit module, conveying the initial node condition to the simulated circuit node, releasing the simulated circuit node from the initial node condition if a condition is met, wherein releasing the simulated circuit node occurs after conveying and enables the circuit simulation device to change a logic state of the simulated circuit node, monitoring the simulated circuit node for a node condition, wherein monitoring occurs after releasing, and outputting an indication, in response to monitoring, when the node condition is in an undesirable state.

31. A simulation method, comprising:

executing phase one by a behavior module, including forcing an initial logic zero, logic one or high-impedance on a node of a circuit module linked with the behavior module, wherein the node represents a simulated electrical connection point of the circuit module, releasing the node, wherein releasing the node enables a simulation program to change a logic state of the node, and wherein releasing occurs after forcing, testing to see if the node has a valid logic value, wherein testing occurs after releasing, if the node has the valid logic value, continuing to phase two, and if the node does not have the valid logic value, continuing in phase one; and simultaneously executing phase two by the behavior module, including monitoring the node value, testing the node value for a valid condition, indicating an error if an unacceptable condition appears on the node, in response to monitoring and testing, and continuing in phase two until simulation completion.

32. The method of claim 31, wherein simulation completion is a user defined time period.

* * * * *